(12) United States Patent
Rahman

(10) Patent No.: US 6,788,101 B1
(45) Date of Patent: Sep. 7, 2004

(54) PROGRAMMABLE INTERFACE CIRCUIT FOR DIFFERENTIAL AND SINGLE-ENDED SIGNALS

(75) Inventor: Arifur Rahman, Yonkers, NY (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/366,956

(22) Filed: Feb. 13, 2003

(51) Int. Cl.[7] .......................................... H03K 19/003
(52) U.S. Cl. ........................... 326/30; 326/86; 326/90; 326/41
(58) Field of Search ...................... 326/30, 86, 38–41, 326/105, 90

(56) References Cited

U.S. PATENT DOCUMENTS

| | | | | |
|---|---|---|---|---|
| 5,600,264 | A | * | 2/1997 | Duong et al. .................. 326/39 |
| 6,177,844 | B1 | * | 1/2001 | Sung et al. .................... 331/25 |
| 6,353,334 | B1 | * | 3/2002 | Schultz et al. ................ 326/82 |
| 6,433,579 | B1 | * | 8/2002 | Wang et al. ................... 326/38 |
| 6,515,508 | B1 | * | 2/2003 | Chang et al. .................. 326/38 |

OTHER PUBLICATIONS

LVDS I/O Interface for Gb/s–per–Pin Operation in 0.35–$\mu$m CMOS, by Andrea Boni et al., IEEE Journal of Solid State Circuits, vol. 36, No. 4, Apr. 2001, pp. 706–711.

* cited by examiner

Primary Examiner—Vibol Tan
(74) Attorney, Agent, or Firm—MacPherson Kwok Chen & Heid LLP; Greg J. Michelson

(57) ABSTRACT

A programmable interface circuit is disclosed, in accordance with one embodiment, which supports differential and single-ended signaling. For example, an input buffer within the programmable interface circuit is configurable to receive differential signals or single-ended signals. A multiplexer provides the appropriate reference signal to the input buffer, when configured to receive single-ended signals, by selecting the reference signal from a plurality of reference buses. The multiplexer, along with a capacitor, may also provide lowpass filtering of the reference signal. Furthermore, an output buffer may be configurable utilizing techniques similar to that described for the input buffer.

19 Claims, 3 Drawing Sheets

PROGRAMMABLE INTERFACE CIRCUIT FOR DIFFERENTIAL AND SINGLE-ENDED SIGNALS

TECHNICAL FIELD

The present invention relates generally to electrical circuits and, more particularly, to interface circuits, such as programmable input/output circuits.

BACKGROUND

Input/output (I/O) circuits are commonly used for transferring data to and from an integrated circuit or other type of electronic device. I/O circuits (also referred to as input/output buffers, receiver/transmitter circuits, or receiver/driver circuits) are often designed to support a specific type of I/O interface standard (e.g., low voltage differential signaling (LVDS) or high-speed transceiver logic (HSTL)) or one signal level requirement type within an I/O interface standard (e.g., a specific type of LVDS). These I/O interface standards generally address chip-to-chip interfaces, board-to-board interfaces, and box-to-box interfaces for a wide range of existing and emerging applications, such as data packet processing, data bus bridges, and high-speed memory interfacing.

For example, FIG. 1 illustrates a conventional single-ended receiver (i.e., input buffer), which receives a supply voltage (VDD) and a reference voltage (VREF), along with an input signal (IN), and provides a corresponding output signal (OUT). A current source is disposed prior to a ground voltage (VSS) to regulate the amount of current flowing through the receiver. The receiver shown in FIG. 1 is generally used for low-speed applications (e.g., up to approximately 300 MHz) for single-ended signals, such as for example HSTL, stub series terminated logic (SSTL), and gunning transceiver logic (GTL) I/O interface standards.

As another example, FIG. 2 illustrates a conventional differential receiver (i.e., input buffer), which receives the supply voltage (VDD) and an input signal (IP) and its complement (IN) and provides differential output signals (OP and ON). The current source and the ground voltage (VSS) are also shown, as discussed in FIG. 1. The receiver shown in FIG. 2 is generally used for high-speed applications (e.g., 1 GHz or higher) for differential signals, such as for example LVDS or current-mode logic (CML) I/O interface standards. Multiple stages of the receiver may be employed as shown for the high-speed applications.

It would be useful for an I/O circuit, such as shown in FIG. 1 or 2, or a bank of I/O circuits to have added flexibility, such as for example to support more than one I/O interface standard or more than one signal level requirement type within an I/O interface standard. However, providing this flexibility often leads to unwanted signal integrity issues, such as the introduction of an unacceptable level of noise, or an unacceptable level of circuit complexity. As a result, there is a need for a flexible programmable interface circuit (e.g., a programmable input circuit and/or output circuit).

SUMMARY

Systems and methods are disclosed herein for providing a programmable interface circuit to support differential and single-ended signals. For example, in accordance with one embodiment, a programmable input circuit is configurable as a single-ended buffer or as a differential buffer. Furthermore, in accordance with another embodiment, one or more multiplexers, which are used to configure the programmable input circuit, also provide a filtering function to reduce high frequency interference and maintain signal integrity.

These techniques are also applicable for a programmable output circuit, which is also discussed herein. Thus, a programmable input buffer and a programmable output buffer, for differential and single-ended signals, are disclosed, which can be implemented, for example, in programmable logic devices (e.g., field programmable gate arrays or complex programmable logic devices) or designed as part of an application specific integrated circuit.

More specifically, in accordance with one embodiment of the present invention, an interface circuit includes a first input buffer having a first and a second input lead, wherein the first input lead is coupled to a first terminal; a plurality of reference buses adapted to provide reference signals; a first multiplexer, coupled to the plurality of reference buses, adapted to provide one of the reference signals from the plurality of reference buses as its output signal; and a second multiplexer, coupled to the first input buffer and the first multiplexer, adapted to provide to the second input lead the output signal from the first multiplexer or an input signal from a second terminal.

In accordance with another embodiment of the present invention, an integrated circuit includes a first input buffer having a first and second lead, wherein the first lead is coupled to a first terminal; a second input buffer having a third and fourth lead, wherein the fourth lead is coupled to a second terminal; means for providing a plurality of reference signals; means for providing one of the plurality of reference signals to the second lead of the first input buffer or coupling the second lead to the second terminal; and means for providing one of the plurality of reference signals to the third lead of the second input buffer or coupling the third lead to the first terminal.

In accordance with another embodiment of the present invention, a circuit includes a multiplexer having a plurality of pass transistors; and a capacitor coupled to the multiplexer, wherein a resistance for at least one of the pass transistors is determined to provide, in combination with a capacitance provided by the capacitor, a lowpass filtering operation for a signal passing through the at least one pass transistor.

In accordance with another embodiment of the present invention, a method for receiving differential and single-ended signals includes providing a differential input buffer having a first and second input lead; coupling a first input signal path to the first input lead; and providing a configurable path to the second input lead, wherein the configurable path can be configured to provide a second input signal path to the second input lead or configured to provide a reference signal path to the second input lead to receive a desired reference signal.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

The preferred embodiments of the present invention and their advantages are best understood by referring to the detailed description that follows. It should be appreciated that like reference numerals are used to identify like elements illustrated in one or more of the figures.

DETAILED DESCRIPTION

Figure 3:
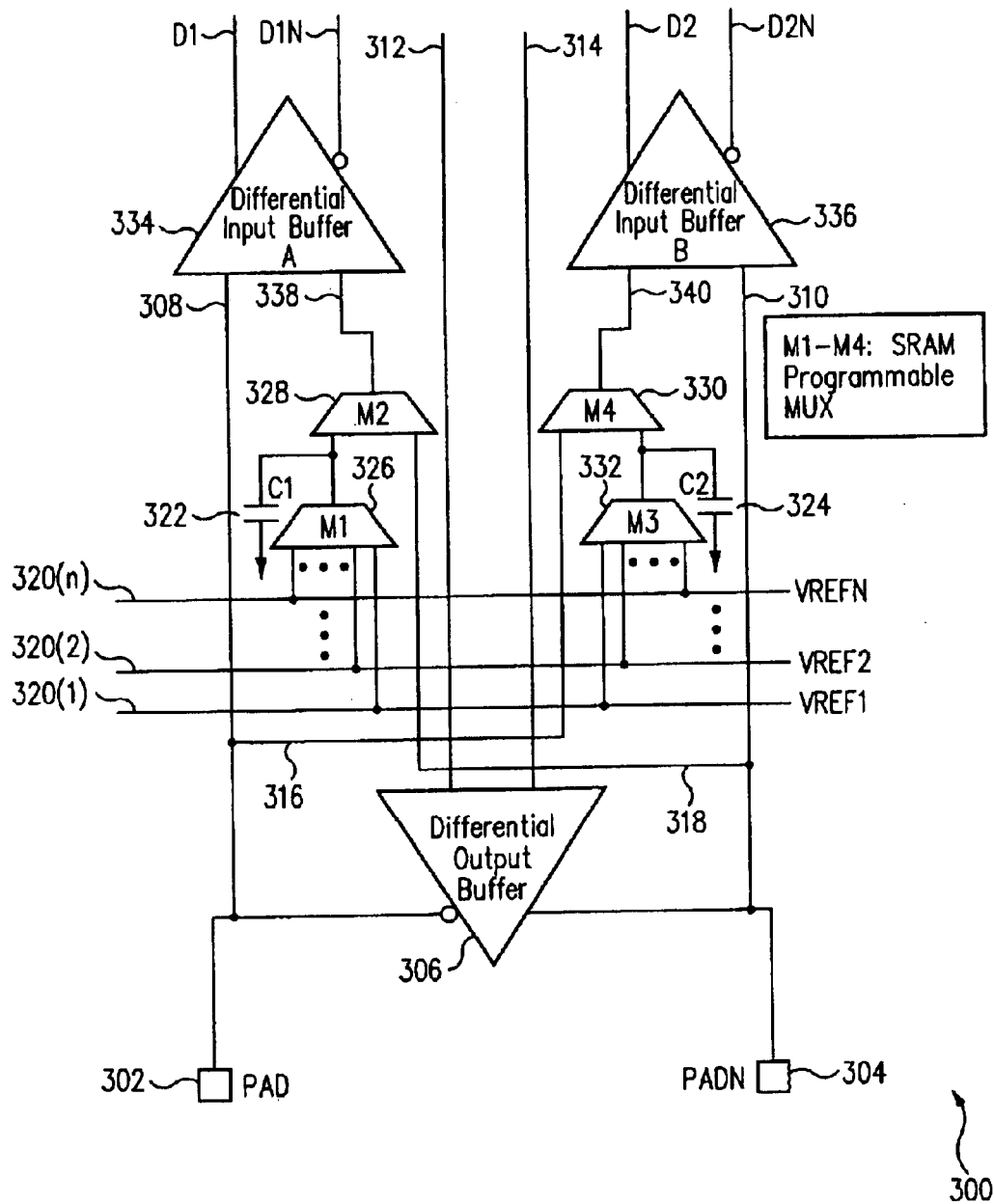
FIG. 3 shows a programmable interface circuit in accordance with an embodiment of the present invention.

FIG. 3 shows a programmable interface circuit 300 in accordance with an embodiment of the present invention. Interface circuit 300 provides for a single input circuit (i.e., input buffer) to receive differential signals and single-ended signals (i.e., reference voltage based signaling), rather than having two respective input circuits (i.e., one input circuit for differential signals and one input circuit for single-ended signals). By providing the programmability to select a reference signal from among multiple reference buses, single-ended signals can be received using a differential input buffer. Consequently, a separate dedicated input buffer for single-ended signals is not required and less chip area is consumed.

Specifically, interface circuit 300 may, for example, be formed as part of an integrated circuit to transfer information (e.g., data or control information) into and out of the integrated circuit via pads 302 and 304 (labeled PAD and PADN, respectively). Interface circuit 300 includes buffers 306, 334, and 336, with buffer 306 utilized as a output buffer to transmit information (from leads 312 and 314) out of the integrated circuit via pads 302 and 304, and buffers 334 and 336 utilized as input buffers to receive external information for the integrated circuit via pads 302 and 304 and provide the information on output leads (labeled D1, D1N and D2, D2N, respectively).

Interface circuit 300 also includes multiplexers 326, 328, 330, and 332, and reference buses 320, which are separately referenced as reference buses 320(1), 320(2), . . . , through 320(n), where "n" represents the number of reference buses 320. Multiplexers 326 and 328 are associated with buffer 334, while multiplexers 330 and 332 are associated with buffer 336.

By utilizing corresponding multiplexers 326 through 332 and reference buses 320, buffers 334 and 336 may be configured as differential buffers or as single-ended buffers. For example, if differential input signals are provided, only one differential input buffer (i.e., buffer 334 or buffer 336) is required. Consequently, buffer 334 may be utilized or buffer 336 may be utilized or buffers 334 and 336 may both be used to receive differential input signals (e.g., in a time multiplexing arrangement). If single-ended signals are provided, buffers 334 and 336 may be configured to simultaneously receive single-ended signals.

Specifically for one example, if buffer 334 is enabled to receive differential signals, an input signal is received via pad 302 (labeled PAD) and a lead 308, while the complement of the input signal is received via pad 304 (labeled PADN) and leads 318 and 338 (i.e., multiplexer 328 selects lead 318 to couple to lead 338). Buffer 334 provides the input signal via output leads (labeled D1 and D1N).

In a similar fashion, if buffer 336 is enabled to receive differential signals (instead of buffer 334 or in a time-shared method with buffer 334), an input signal is received via pad 304 on a lead 310, while the complement of the input signal is received via pad 302 and leads 316 and 340 (i.e., multiplexer 330 selects lead 316 to couple to lead 340). Buffer 336 provides the input signal via output leads (labeled D2 and D2N).

As another example, if single-ended signals (i.e., voltage reference based signals) are to be received, buffers 334 and 336 can operate simultaneously to receive corresponding single-ended signals through pads 302 and 304. Specifically, one single-ended signal is received by buffer 334 via pad 302 and lead 308, while another single-ended signal is received by buffer 336 via pad 304 and lead 310.

Buffers 334 and 336, when configured to receive single-ended signals, require a reference signal having an appropriate voltage level. The required reference signal for each of buffers 334 and 336 can be provided on reference buses 320 and selected by multiplexers 326 and 332. For example, if buffer 334 requires a reference signal carried on reference bus 320(2), then multiplexer 326 can be controlled to select reference bus 320(2) and provide the associated reference signal as its output signal to multiplexer 328, which is controlled to route the reference signal to lead 338 of buffer 334.

As another example, if buffer 336 requires a reference signal (e.g., that is different than that required by buffer 334) carried on reference bus 320(1), then multiplexer 332 can be controlled to select reference bus 320(1) and provide the associated reference signal as its output signal to multiplexer 330, which is controlled to route the reference signal to lead 340 of buffer 336. Thus, the appropriate reference signals can be provided on reference buses 320, which can then be selected by multiplexers 326 and 332 and provided via corresponding multiplexers 328 and 330 to buffers 334 and 336, respectively.

Multiplexers 326 through 332 may be transistor-based multiplexers and controlled via a control signal. The control signals may be provided, for example, by a control circuit (e.g., a microcontroller) or by memory cells (e.g., a static random access memory (SRAM) cells) whose memory bits are programmed to provide the desired control signals to multiplexers 326 through 332. Multiplexers 326 and 332 are controlled to select the appropriate reference signal from reference buses 320, while multiplexers 328 and 330 are controlled to select a corresponding signal from pads 304 and 302 or from multiplexers 326 and 332, respectively.

It should be understood that the number of multiplexers required may vary, depending upon the application. For example, if only two different reference signals are required, then only two reference buses 320 (i.e., reference bus 320(1) and 320(2) of FIG. 3) are needed. Therefore, the functions of multiplexers 326 and 328, for example, could be performed by one multiplexer that routes a signal from either reference bus 320(1), 320(2), or pad 304 to buffer 334. The one multiplexer, along with capacitor 322, may also provide lowpass filtering of the routed signal. As another example, if a large number of reference signals are required, then additional multiplexers may be required to select from the large number of reference buses 320 or pad 304 and provide a resulting output signal on lead 338 of buffer 334.

As shown in FIG. 3, interface circuit 300 also includes capacitors 322 and 324 (labeled C1 and C2, respectively). Capacitors 322 and 324 along with corresponding multiplexers 326 and 332 can be made utilized to provide a lowpass filtering function to filter out high frequency noise from the reference signals on reference buses 320. Specifically, the combination of multiplexer 326 and capacitor 322 or multiplexer 332 and capacitor 324 can provide lowpass filtering by forming a resistor-capacitor (RC) lowpass filter.

For example, by adjusting the width/length ratio of pass transistors within multiplexers 326 and 332, a desired on resistance of the pass transistor, referred to as "$R_P$", can be determined, which can correlate to a specific cutoff frequency. Thus, based on the combination of the resistance $R_P$ contributed by multiplexer 326 and capacitance "C" contributed by capacitor 322, the cutoff frequency can be determined approximately, for example, by the equation $1/(R_PC)$.

As a specific example, if the capacitance C of capacitor 322 is 1 pF and the resistance Rp of multiplexer 326 is 20 kΩ(e.g., implemented with NMOS (n-channel metal oxide semiconductor) and PMOS (p-channel metal oxide semiconductor) transistors having a width and length of 1 micron, the resulting cutoff frequency would be approximately 50 MHz. Note also that capacitor 322 could be formed and implemented as a transistor to provide the desired capacitance.

Interface circuit 300 is ideal for a wide range of single-ended signal levels or standards, where the reference voltage may vary significantly for various types of I/O interface standards, because the desired reference voltages can be made available on the reference buses (e.g., the reference voltage may be selectable over a range from a supply voltage level to a ground voltage level). Furthermore, by optionally incorporating a lowpass filter (i.e., an RC implementation from a capacitor and a multiplexer combination), high frequency noise may be reduced from the reference voltage received from a reference bus.

The input and output buffer configuration can be utilized to provide a pair of programmable input-output buffers in programmable devices (e.g., programmable logic devices, such as field programmable gate arrays or complex programmable logic devices) or to provide flexible designs for application specific integrated circuits. Furthermore, interface circuit 300 may be replicated to form a bank of interface circuits (e.g., input/output circuit bank).

Figure 1:
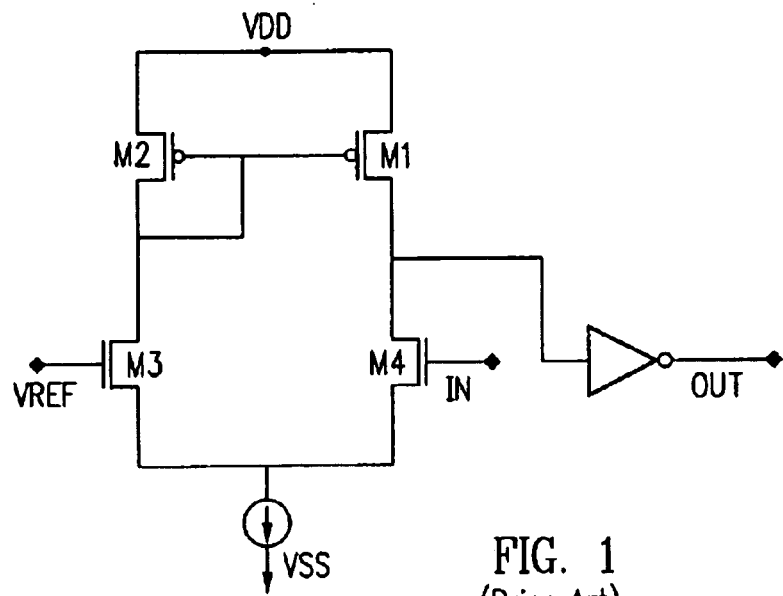
FIG. 1 shows a conventional single-ended receiver.
Figure 2:
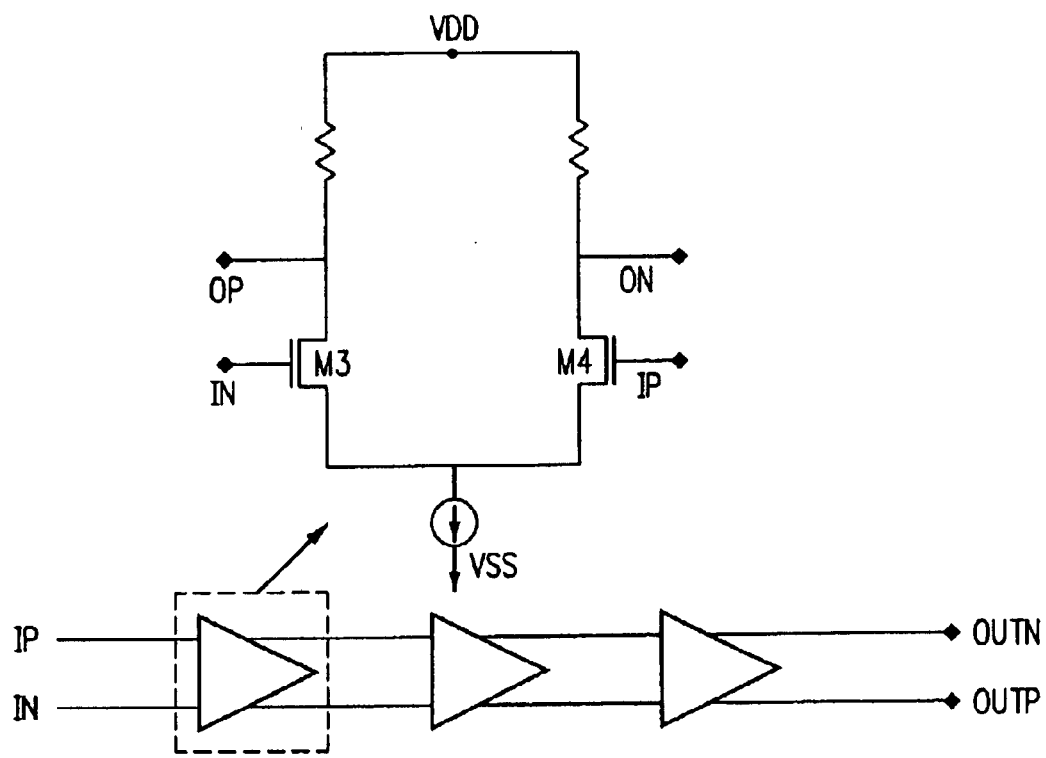
FIG. 2 shows a conventional differential receiver.
Figure 4:
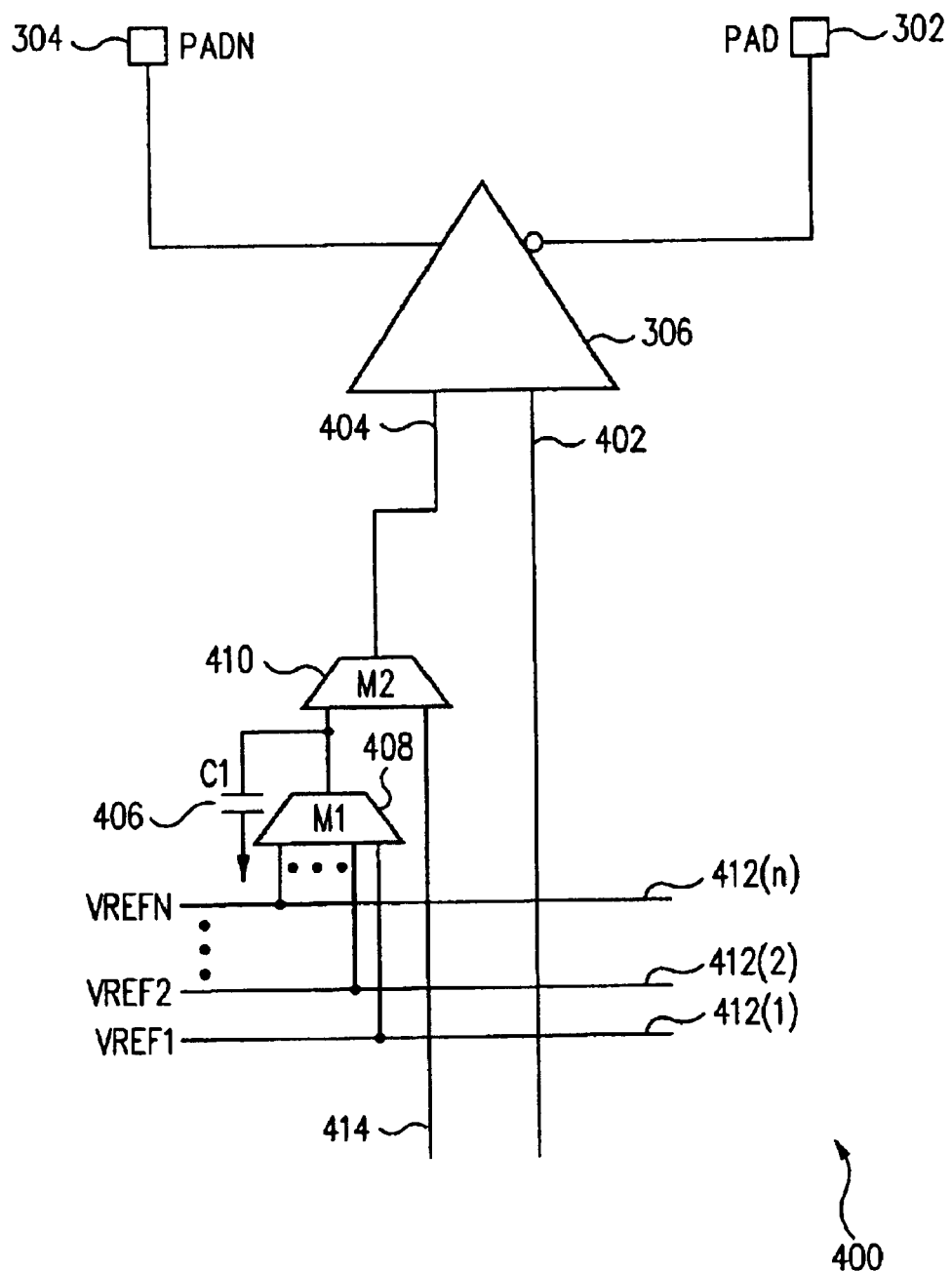
FIG. 4 shows a programmable interface circuit in accordance with another embodiment of the present invention.

The programmable input path, described in reference to FIG. 3 by employing one or more multiplexers, allows for increased functionality for a differential buffer (e.g., as described in reference to FIG. 2). Thus, the functionality of a single-ended buffer, such as described in reference to FIG. 1, is incorporated into the implementation of a differential buffer (e.g., FIG. 2). For example, as illustrated in FIGS. 3 and 4, buffers 306, 334, and 336 may be implemented as differential input buffers, with the techniques and methods disclosed herein providing buffers 306, 334, and 336 with the capability to receive single-ended signals. Furthermore, by designing one or more of the multiplexers to provide a filtering function, such as in conjunction with an optional capacitor, noise and other interfering signals may be reduced and signal integrity may be sufficiently maintained.

FIG. 4 shows a programmable interface circuit 400 in accordance with another embodiment of the present invention. Interface circuit 400 includes pads 302 and 304 and buffer 306 and illustrates that the programmability features of buffers 334 and 336 (i.e., input buffers), discussed in reference to FIG. 3, may be applied also to buffer 306, which functions as an output buffer.

Specifically, buffer 306 may function to receive differential signals or single-ended signals. For differential signals, buffer 306 receives true and complement signals on respective leads 402 and 404, with lead 404 coupled to a lead 414 via a multiplexer 410. For single-ended signals, buffer 306 receives a signal on lead 402 and receives a desired reference signal on lead 404 from one of reference buses 412 via multiplexers 408 and 410. As discussed similarly above in reference to FIG. 3, reference buses 412 (separately referenced as reference buses 412(1), 412(2), ... through 412(n)) carry one or more reference signals, which can be selected by multiplexer 408 and provided on lead 404 via multiplexer 410.

Furthermore, multiplexer 408, in combination with a capacitor 406, can provide a lowpass filtering operation (as discussed similarly above in reference to FIG. 3) to filter high frequency noise carried on reference bus 412 selected by multiplexer 408. Thus, for example, as taught by interface circuit 400, buffer 306 of FIG. 3 may be provided with the capability to receive differential or single-ended signals. For example, buffer 306 of FIG. 3 may receive reference signals, when configured to receive single-ended signals, from reference buses 320, utilizing techniques discussed in reference to FIG. 4 (i.e., buffer 306 receives reference signals from reference buses 320 as is done similarly by buffers 334 and 336).

Buffers 306, 334, and 336 (as shown in FIGS. 3 and/or 4) may be further configured to provide a programmable common mode voltage or programmable common made termination, such as respectively disclosed in U.S. Pat. No. 6,639,434B1 entitled "Low Voltage Differential Signaling Systems and Methods" filed Oct. 7, 2002 and U.S. Pat. No. 6.700,823B1 entitled "Programmable Common Mode Termination for Input/Output Circuits" filed Oct. 30, 2002, which are incorporated herein by reference in their entirety. Furthermore, interface circuits 300 and 400 may be configurable to receive reference signals via one or both of pads 302 and 304 that are to be carried by reference buses 320 and/or 412 by utilizing techniques discussed in U.S. patent application Ser. No. 10/367,323 entitled "Noise Reduction Techniques For Programmable Input/Output Circuits" filed Feb. 13, 2003, by Arifur Rahman and Harold Scholz, which is incorporated herein by reference in its entirety.

One or more of the techniques discussed herein may simplify implementation or development efforts due to a buffer having the capability to support multiple single-ended and differential signaling levels. Consequently, design and verification efforts may be reduced. Furthermore, the lowpass filter implementation preserves signal integrity and, by efficient use of resources by utilizing one or more of the multiplexers, a dedicated resistor and possibly other associated elements are not required, which would consume valuable circuit space (e.g., silicon area).

Embodiments described above illustrate but do not limit the invention. It should also be understood that numerous modifications and variations are possible in accordance with the principles of the present invention. Accordingly, the scope of the invention is defined only by the following claims.

I claim:
1. An interface circuit comprising:
a first input buffer having a first and a second input lead, wherein the first input lead is coupled to a first terminal;
a plurality of reference buses adapted to provide reference signals;
a first multiplexer, coupled to the plurality of reference buses, adapted to provide one of the reference signals from the plurality of reference buses as its output signal; and
a second multiplexer, coupled to the first input buffer and the first multiplexer, adapted to provide to the second input lead the output signal from the first multiplexer or an input signal from a second terminal.

2. The circuit of claim 1, wherein the input buffer receives differential input signals via the first and second terminal when the second multiplexer provides the input signal from the second terminal to the second input lead, and receives single-ended signals via the first terminal when the second multiplexer provides the output signal from the first multiplexer to the second input lead.

3. The circuit of claim 1, further comprising a capacitor coupled to the first multiplexer.

4. The circuit of claim 3, wherein a resistance provided by the first multiplexer and a capacitance provided by the capacitor results in a lowpass filter operation being performed on the reference signal provided as the output signal of the first multiplexer.

5. The circuit of claim 4, wherein the resistance of the first multplexer is determined by setting a desired on-resistance R of the first multiplexer which correlates to a specific cutoff frequency according to an equation $1/(RC)$, where C is the capacitance of the capacitor.

6. The circuit of claim 1, further comprising an output buffer, coupled to the first and second terminal, adapted to provide output signals via the first and second terminal.

7. The circuit of claim 1, further comprising:
a second input buffer having a third and a fourth input lead, wherein the third input lead is coupled to the second terminal;
a third multiplexer, coupled to the plurality of reference buses, adapted to provide one of the reference signals from the plurality of reference buses as its output signal;
a fourth multiplexer, coupled to the second input buffer and the third mutiplexer, adapted to provide to the fourth input lead the output signal from the third multiplexer or an input signal from the first terminal.

8. The circuit of claim 7, further comprising:
a first capacitor coupled to the first multiplexer, wherein a resistance of the first multiplexer and a capacitance of the first capacitor results in a lowpass filtering operation being performed on the reference signal provided as the output signal of the first multiplexer; and
a second capacitor to the third multiplexer, wherein a resistance of the third multiplexer and a capacitance of the second capacitor results in a lowpass filtering operation being performed on the reference signal provided as the output signal of the third multiplexer.

9. The circuit of claim 8, further comprising an output buffer, coupled to the first and second terminal, adapted to provide output signals via the first and second terminal.

10. The circuit of claim 9, wherein the output buffer further comprises means for receiving differential signals or single-ended signals.

11. The circuit of claim 10, wherein the interface circuit is one of a plurality of interface circuits that form a bank of input/output circuits.

12. An integrated circuit comprising:
a first input buffer having a first and second lead, wherein the first lead is coupled to a first terminal;
a second input buffer having a third and fourth lead, wherein the fourth lead is coupled to a second terminal;
means for providing a plurality of reference signals;
means for providing one of the plurality of reference signals to the second lead of the first input buffer or coupling the second lead to the second terminal; and
means for providing one of the plurality of reference signals to the third lead of the second input buffer or coupling the third lead to the first terminal.

13. The integrated circuit of claim 12, wherein the first input buffer is configured to receive differential signals when the second lead is coupled to the second terminal, the second input buffer is configured to receive differential signals when the third lead is coupled to the first terminal, and the first input buffer and the second input buffer are configured to receive single-ended signals when the second lead and the third lead are provided with a selected one of the reference signals.

14. The integrated circuit of claim 12, further comprising means for filtering the reference signals provided to the second lead of the first input buffer and the third lead of the second input buffer.

15. The integrated circuit of claim 14, further comprising an output buffer, coupled to the first terminal and the second terminal.

16. The integrated circuit of claim 15, further comprising means for providing a differential signal or a single-ended signal and a selected reference signal to the output buffer, which provides an output signal via the first and second terminals.

17. A method for receiving differential and single-ended signals, the method comprising:
providing a differential input buffer having a first and second input lead;
coupling a first input signal path to the first input lead; and
providing a configurable path to the second input lead, wherein the configurable path can be configured to provide a second input signal path to the second input lead or configured to provide a reference signal path to the second input lead to receive a desired reference signal.

18. The method of claim 17, wherein the differential input buffer is capable of receiving a differential signal when the configurable path is configured to provide a second input path, and is capable of receiving a single-ended signal when the configurable path is configured to provide a reference signal path.

19. The method of claim 18, further comprising providing a filtering operation to filter the reference signal on the reference signal path.

* * * * *